US012706576B2

(12) United States Patent
Hunter

(10) Patent No.: US 12,706,576 B2
(45) Date of Patent: Aug. 11, 2026

(54) AMPLIFIER WITH ADAPTIVE BIASING

(71) Applicant: Texas Instruments Incorporated, Dallas, TX (US)

(72) Inventor: Bradford Lawrence Hunter, Spicewood, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 645 days.

(21) Appl. No.: 17/538,163

(22) Filed: Nov. 30, 2021

(65) Prior Publication Data

US 2023/0170864 A1 Jun. 1, 2023

(51) Int. Cl.
*H03F 3/45* (2006.01)
*G05F 1/46* (2006.01)
*G05F 3/26* (2006.01)

(52) U.S. Cl.
CPC ......... *H03F 3/45183* (2013.01); *G05F 1/461* (2013.01); *G05F 3/262* (2013.01); *H03F 3/45273* (2013.01)

(58) Field of Classification Search
CPC .. H03F 3/45183; H03F 3/45273; H03F 1/301; G05F 1/461; G05F 3/262; G05F 1/562; G05F 1/565; G05F 1/575
USPC .......................................................... 330/296
See application file for complete search history.

(56) References Cited

U.S. PATENT DOCUMENTS 7,528,661 B2 * 5/2009 Damitio .................. H03F 1/307
330/267

* cited by examiner

*Primary Examiner* — Andrea Lindgren Baltzell
*Assistant Examiner* — Khiem D Nguyen
(74) *Attorney, Agent, or Firm* — Charles F. Koch

(57) ABSTRACT

An amplifier circuit includes an amplifier, a resistor, and an adaptive bias circuit. The amplifier includes an output and a tail input. The amplifier is configured to generate an output signal representative of a difference of a first input signal and a second input signal. The resistor is coupled to the output of the amplifier. The resistor is configured to lower an output resistance of the amplifier. The adaptive bias circuit is coupled between the output of the amplifier and the tail input of the amplifier. The adaptive bias circuit is configured to generate a detection current based on the output signal, and provide the detection current to the tail input of the amplifier to increase the gain of the amplifier based on the output signal.

17 Claims, 2 Drawing Sheets

Vout
VDD
204
WITHOUT ADAPTIVE BIASING
WITH ADAPTIVE BIASING
206
$A_V = g_m X R$
VDD-(VthM1)-Iref*R
202
208
212
$A_V = g_m X^2 R$
(Vin/2-)-(VthM2)
210
214
0
(Vin/2-)-(Vin/2+)

AMPLIFIER WITH ADAPTIVE BIASING

BACKGROUND

A low dropout or LDO linear voltage regulator is an electronic circuit that is designed to provide a stable DC output voltage regardless of input voltage variations. An LDO linear voltage regulator is able to maintain output regulation even for a relatively small difference between the input voltage and the output voltage. For example, when regulating the voltage from a battery, an LDO regulator can maintain a steady output voltage for input voltages ranging from high battery voltages down to voltage levels just above the output voltage.

SUMMARY

In one example, an amplifier circuit includes an amplifier, a power supply terminal, a resistor, and an adaptive bias circuit. The amplifier includes an output and a tail input. The resistor is coupled between the power supply terminal and the output of the amplifier. The adaptive bias circuit includes a source degenerated detector circuit and a source degenerated current mirror circuit. The source generated detector includes an input coupled to the output of the amplifier, and an output. The source degenerated current mirror circuit includes an input coupled to the output of the detector circuit, and an output coupled to the tail input of the amplifier.

In another example, an amplifier circuit includes an amplifier, a resistor, and an adaptive bias circuit. The amplifier includes an output and a tail input. The amplifier is configured to generate an output signal representative of a difference of a first input signal and a second input signal. The resistor is coupled to the output of the amplifier. The resistor is configured to lower an output resistance of the amplifier. The adaptive bias circuit is coupled between the output of the amplifier and the tail input of the amplifier. The adaptive bias circuit is configured to generate a detection current based on the output signal, and provide the detection current to the tail input of the amplifier to increase the gain of the amplifier based on the output signal.

In a further example, a voltage regulator circuit includes an error amplifier, a load resistor, an adaptive bias circuit, a pass transistor, and an output terminal. The output terminal is adapted to be coupled to a load circuit. The error amplifier includes an output and a tail input. The error amplifier is configured to generate an error signal representative of a difference of an output voltage and a reference voltage. The load resistor is coupled to the output of the error amplifier. The load resistor is configured to lower an output resistance of the error amplifier. The adaptive bias circuit is coupled between the output of the error amplifier and the tail input of the error amplifier. The adaptive bias circuit is configured to generate a detection current based on the error signal, and provide the detection current to the tail input of the error amplifier to increase the gain of the error amplifier based on the error signal. The pass transistor is coupled to the output of the error amplifier. The pass transistor is configured to pass a load current to the output terminal responsive to the error signal.

BRIEF DESCRIPTION OF THE DRAWINGS

For a detailed description of various examples, reference will now be made to the accompanying drawings.

The same reference number is used in the drawings for the same or similar (either by function and/or structure) features.

DETAILED DESCRIPTION

Linear voltage regulators implemented with a p-type output driver and an external capacitor can be difficult to stabilize with low quiescent bias current. Some multistage amplifier circuits employ Miller compensation to improve stability. However, Miller compensation reduces power supply noise rejection, and is therefore not ideal for use in linear voltage regulators and other applications that are sensitive to power supply noise.

In some voltage regulators, compensation is implemented by providing a resistor that is coupled between the output of the amplifier's first stage and the power supply rail by a diode-connected transistor to reduce the output impedance and gain of the amplifier's first stage. However, reducing the gain of the amplifier also reduces the amplifier's ability to respond to a wide range of load currents, and is therefore undesirable. The gain of the amplifier may be increased by increasing tail current in the first stage or increasing the resistance of the resistor coupled to the first stage output, but these options increase power consumption or decrease stability.

The amplifier circuit described herein includes adaptive biasing that increases the gain of the amplifier without creating a dominant pole (in contrast with Miller compensation) or increasing amplifier quiescent current. The adaptive biasing maintains a small tail current in the amplifier when operating under steady state conditions to enable low quiescent current, and increases the tail current when load current increases to increase amplifier gain. When providing feedback to the amplifier, the adaptive bias circuit sets the gain of the amplifier as a ratio of resistor values using source degeneration.

Figure 1:
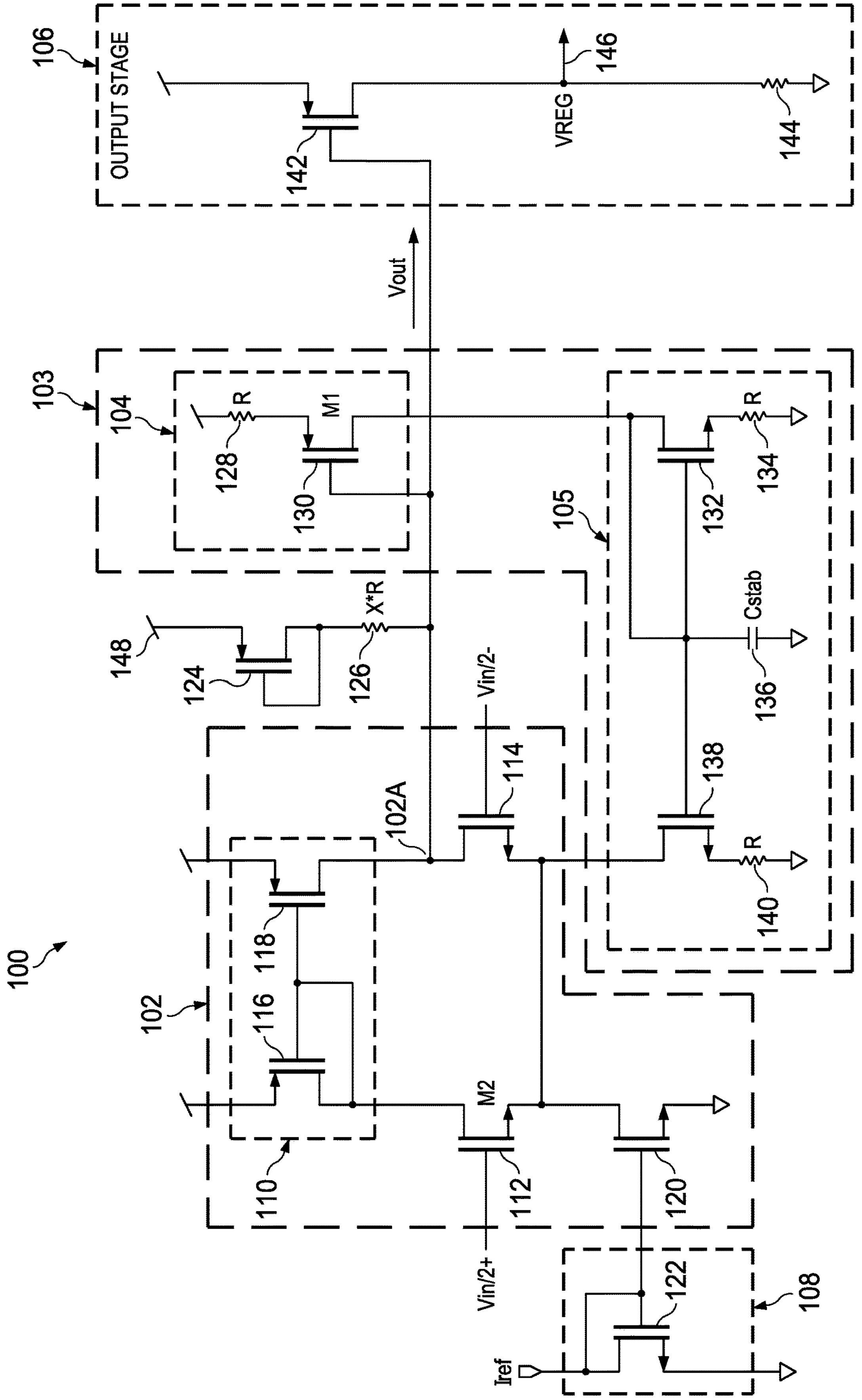
FIG. 1 is a schematic level diagram for an example voltage regulator circuit that includes an amplifier with an adaptive bias circuit as described herein.

FIG. 1 is a schematic level diagram for an example voltage regulator circuit 100 that includes adaptive biasing. The voltage regulator circuit 100 includes an amplifier 102, an adaptive biasing circuit 103, an output stage 106, a load resistor 126, and a diode-connected transistor 124. The amplifier 102 operates as an error amplifier in the voltage regulator circuit 100, and may serve as the input stage for a multistage amplifier. The amplifier 102 includes a transistor 112 and a transistor 114 connected as a differential pair. The gate of the transistor 112 serves as a first signal input of the amplifier 102, and the gate of the transistor 114 serves as a second signal input of the amplifier 102. A current mirror 110 is coupled to the drain of the transistor 112 and the drain of the transistor 114. The current mirror 110 provides bias current to the transistor 112 and the transistor 114. The current mirror 110 includes a diode-connected transistor 116 and a transistor 118 coupled to form a current mirror circuit.

The source of the transistor 112 is coupled to the source of the transistor 114. A transistor 120 sinks tail current from the transistor 112 and the transistor 114. The transistor 120 is coupled to a diode-connected transistor 122 to form a current mirror circuit. A reference current (Iref) flows through the diode-connected transistor 122, and a mirrored tail current flows through the transistor 120. The drain of the transistor 114 serves as the output 102A of the amplifier 102, and the source of the transistor 114 serves as a tail input of the amplifier 102. The amplifier 102 shown in FIG. 1 is an example of a variety of amplifier circuit that may be utilized in the voltage regulator circuit 100.

The load resistor 126 is coupled to the output 102A of the amplifier 102, and is coupled, via the diode-connected transistor 124 to a power supply terminal 148. A first current terminal (source) of the diode-connected transistor 124 is coupled to the power supply terminal 148. A second current terminal (drain) of the diode-connected transistor 124 is coupled to a control terminal (gate) of the diode-connected transistor 124, and to a first terminal of the load resistor 126. A second terminal of the load resistor 126 is coupled to the output 102A of the amplifier 102. When the voltage (Vout) at the output 102A of the amplifier 102 turns on the diode-connected transistor 124, the load resistor 126 reduces the output impedance of the amplifier 102 and the gain of the amplifier 102. The diode-connected transistor 124 may be p-type field effect transistor (FET). Some implementations of the 100 may include multiple instances of the diode-connected transistor 124 (multiple diode-connected transistors) coupled in series between the power supply terminal 148 and the load resistor 126.

The output stage 106 is coupled to the output 102A of the amplifier 102. The output stage 106 passes current to a load circuit (not shown) responsive to the voltage at the output 102A of the amplifier 102. The output stage 106 includes a pass transistor 142 and a resistor 144. The pass transistor 142 includes a first current terminal (source) coupled to the power supply terminal 148, a second current terminal (drain) coupled to the resistor 144, and a control terminal (gate) coupled to the output 102A of the amplifier 102. The second current terminal of the pass transistor 142 is coupled to an output terminal 146 of the voltage regulator circuit 100. A first terminal of the resistor 144 is coupled to ground (a ground terminal), and a second terminal of the resistor 144 is coupled to the second current terminal of the pass transistor 142. The pass transistor 142 may be a p-type FET. A load circuit (not shown) may be coupled to the output terminal 146.

The adaptive biasing circuit 103 is coupled to the output 102A of the amplifier 102 and to the tail input of the amplifier 102. The adaptive biasing circuit 103 detects the output voltage of the amplifier 102 and provides a tail current in the amplifier 102 that is based on the detected output voltage of the amplifier 102. The adaptive biasing circuit 103 includes a source degenerated detector circuit 104 and a source degenerated current mirror circuit 105. The source degenerated detector circuit 104 detects the output voltage of the amplifier 102, and generates a detection current. The source degenerated current mirror circuit 105 mirrors the detection current as tail current in the amplifier 102 to increase the gain of the amplifier 102.

The source degenerated detector circuit 104 includes a transistor 130 and a resistor 128. The transistor 130 may be a p-type FET. A control terminal (gate) of the transistor 130 is coupled to the output 102A of the amplifier 102. A first current terminal (source) of the transistor 130 is coupled to the power supply terminal 148 via the resistor 128. A second current terminal (drain) of the transistor 130 is coupled to the source degenerated current mirror circuit 105. As the amplitude of signal output by the amplifier 102 increases, the voltage at the output 102A of the amplifier 102 decreases, the transistor 130 turns on, and the current flowing through the source degenerated detector circuit 104 increases.

The source degenerated current mirror circuit 105 includes a transistor 132, a resistor 134, a capacitor 136, a transistor 138, and a resistor 140. The transistor 132 and the transistor 138 may n-type FETs. The current flowing through the source degenerated detector circuit 104 also flows through the transistor 132 and the resistor 134. A first current terminal (drain) of the transistor 132 and a control terminal (gate) of the transistor 132 are coupled to the second current terminal (drain) of the transistor 130. A second current terminal (source) of the transistor 132 is coupled to ground via the resistor 134. The capacitor 136 is coupled between the control terminal of the transistor 132 and ground to stabilize (e.g., filter high-frequency signal) the control terminals of the transistors 132 and 138.

The transistor 138 is coupled to the transistor 132 and to the tail input of the amplifier 102. The transistor 138 includes a first current terminal (drain) coupled to the tail input of the amplifier 102. A second current terminal (source) of the transistor 138 is coupled to ground via the resistor 140. A control terminal (gate) of the transistor 138 is coupled to the control terminal of the transistor 132. Current flowing the transistor 132 is mirrored in the transistor 138 as tail current of the amplifier 102.

In the adaptive biasing circuit 103, the resistors 128, 134, and 140 (degeneration resistors) may have about the same resistance value (R), while the load resistor 126 may have a different resistance value (X*R). For example, the resistance of the load resistor 126 may be greater than a resistance of the resistors 128, 134, and 140. Because all of the resistor values are balanced and cancel, the adaptive biasing circuit 103 introduces a gain factor of X. The values of the resistors may be selected to set the gain factor X. Thus, as the output voltage of the amplifier 102 increases, the source degenerated detector circuit 104 generates a detection current based on the output voltage, and the detection current generates (via the source degenerated current mirror circuit 105) an increase in the tail current flowing in the amplifier 102. The increased tail current increases the gain of the amplifier 102 with increasing output signal amplitude, while the quiescent current of the amplifier 102 remains low.

Figure 2:
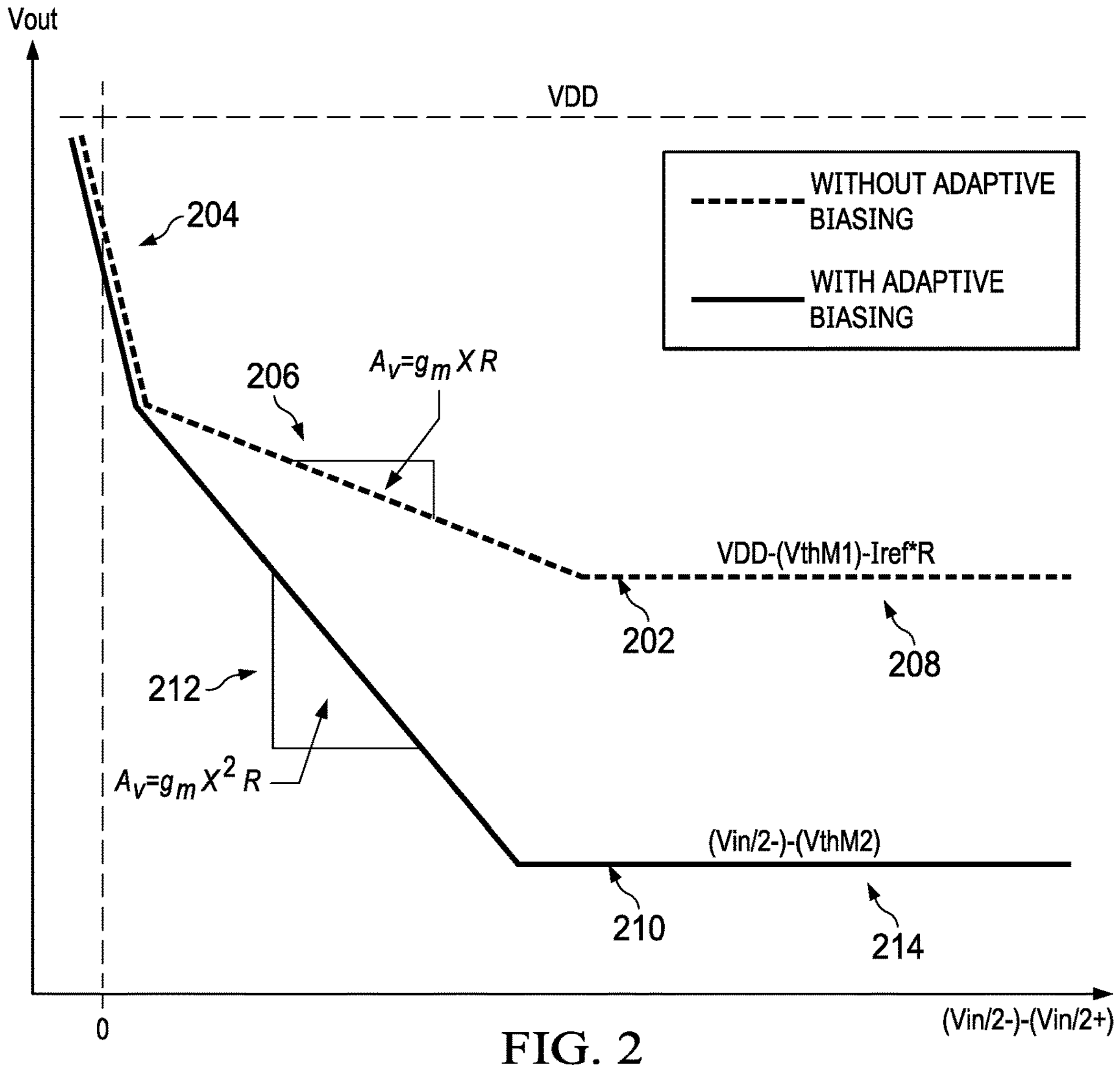
FIG. 2 is a graph comparing output voltage of the amplifier of FIG. 1 to output voltage of an amplifier that lacks the adaptive bias circuit of FIG. 1.

FIG. 2 is a graph comparing output voltage (Y-axis) of the amplifier 102, relative to differential input voltage (X-axis), to output voltage of an amplifier that includes the load resistor 126, but lacks the adaptive biasing circuit 103. In FIG. 2, the voltage transfer curve 210 represents the output voltage of the amplifier 102, and the voltage transfer curve 202 represents the output voltage of an amplifier that includes the load resistor 126, but lacks the adaptive biasing circuit 103. In the region 204 of both the voltage transfer curve 202 and the voltage transfer curve 210, as the voltage differential at the inputs of the amplifier increases, both amplifiers exhibit high gain. The region of high gain is determined by the intrinsic output resistance of the amplifier without inclusion of the load resistor 126 (the diode-connected transistor 124 is off).

As the output voltage of the amplifier increases, the diode-connected transistor 124 turns on and the gain of the amplifiers is reduced relative that of the region 204. In the region 206 of the voltage transfer curve 202, the gain of the amplifier is set by the transconductance of the input differential pair (transistors 112 and 114) and the load resistor 126. In the region 212 of the voltage transfer curve 210, the gain of the amplifier 102 is boosted by the adaptive biasing circuit 103 (feedback loop gain ratio X). Thus, due to the adaptive biasing circuit 103, the amplifier 102 provides higher gain than an amplifier lacking the adaptive biasing circuit 103.

In region 208 of the voltage transfer curve 202, the output voltage of the amplifier lacking the adaptive biasing circuit 103 is limited by the reference current (Iref) and the resistance of the load resistor 126. In the region 214 of the voltage transfer curve 210, the output voltage of the amplifier 102 is substantially lower than that of the amplifier lacking the adaptive biasing circuit 103 because the adaptive biasing circuit 103 allows the output swing of the amplifier 102 to increase without being limited to the magnitude of the reference current (Iref).

Figure 3:
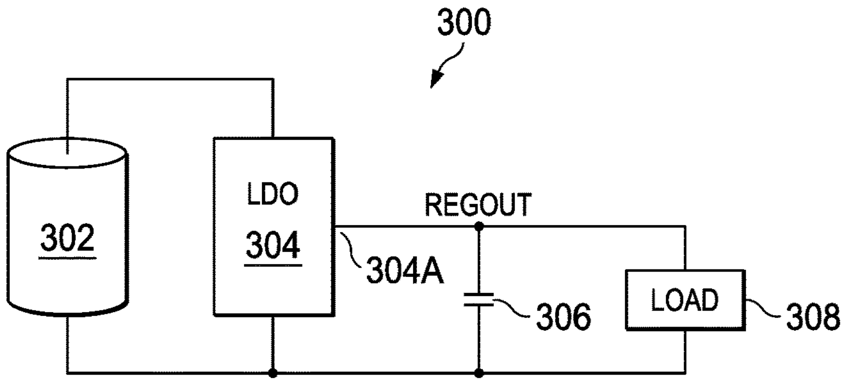
FIG. 3 is a block diagram for an electronic circuit that includes the voltage regulator of FIG. 1.

FIG. 3 is a block diagram for an electronic circuit 300 that includes an example of the voltage regulator circuit 100. The electronic circuit 300 includes a voltage source 302, a low-dropout regulator 304, an output capacitor 306, and a load circuit 308. The voltage source 302 may be a battery, a solar cell, a power supply, or other voltage source. The voltage source 302 is coupled to the low-dropout regulator 304. The low-dropout regulator 304 provides a predetermined output voltage at the output 304A for powering the load circuit 308. The low-dropout regulator 304 includes an implementation of the voltage regulator circuit 100. For example, in the low-dropout regulator 304, the amplifier 102 is an error amplifier that generates an error signal representative of the difference in a reference voltage and the voltage at the low-dropout regulator 304. The output stage 106 is coupled to the error amplifier to pass current to the output capacitor 306 and the load circuit 308 in response to the error signal. The output capacitor 306 and the load circuit 308 are coupled to the output 304A of the low-dropout regulator 304. The output capacitor 306 provides charge storage for meeting transient current demands of the load circuit 308. The load circuit 308 may be processor, such as a microcontroller, or any other circuit. Inclusion of the voltage regulator circuit 100 allows the low-dropout regulator 304 to operate with low quiescent current while providing increased gain to improve response to the changing current demands of the load circuit 308.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

While the use of particular transistors is described herein, other transistors (or equivalent devices) may be used instead. For example, a p-type metal-oxide-silicon field effect transistor ("MOSFET") may be used in place of an n-type MOSFET with little or no changes to the circuit. Furthermore, other types of transistors may be used (such as bipolar junction transistors (BJTs)).

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

Modifications are possible in the described embodiments, and other embodiments are possible, within the scope of the claims.

What is claimed is:

1. An amplifier circuit, comprising:

an amplifier having an amplifier input, a tail current input, and an amplifier output;

a resistor having first and second terminals, the second terminal coupled to the amplifier output;

an adaptive bias circuit including:

a detector circuit having a detector input and a detector output, wherein the detector input is coupled to the amplifier output;

a current mirror circuit having a current mirror input and a current mirror output, wherein the current mirror input is coupled to the detector output; and a transistor having first and second current terminals and a first control terminal, wherein the first current terminal is coupled to a power supply terminal, the second current terminal is coupled to the first terminal of the resistor, and the first control terminal is coupled to the second current terminal.

2. The amplifier circuit of claim 1, wherein the resistor is a first resistor and the transistor is a first transistor, and the detector circuit includes:

a second transistor having third and fourth current terminals and a second control terminal, wherein the third current terminal is coupled to the current mirror input; and a second resistor having a first terminal coupled to the fourth current terminal and a second terminal coupled to the power supply terminal.

3. The amplifier circuit of claim 2, wherein the current mirror circuit includes:

a third transistor having fifth and sixth current terminals and a third control terminal, wherein the fifth current terminal is coupled to the third current terminal, and the third control terminal is coupled to the third current terminal;

a third resistor having a first terminal coupled to the sixth current terminal and a second terminal coupled to a ground terminal;

a fourth transistor having seventh and eighth current terminals and a fourth control terminal, wherein the seventh current terminal is coupled to the tail current input of the amplifier, and the fourth control terminal is coupled to the third current terminal; and a fourth resistor having a first terminal coupled to the eighth current terminal and a second terminal coupled to the ground terminal.

4. The amplifier circuit of claim 3, wherein the current mirror circuit includes a capacitor having a first terminal coupled to the third control terminal and a second terminal coupled to the ground terminal.

5. The amplifier circuit of claim 3, wherein a gain boost provided to the amplifier by the adaptive bias circuit is a ratio of a resistance of the first resistor to a resistance of the second resistor.

6. The amplifier circuit of claim 1, wherein the transistor is a first transistor, and the amplifier includes:

a second transistor having third and fourth current terminals and a second control terminal, wherein the third current terminal is coupled to a first current source, the fourth current terminal is coupled to a second current source, and the second control terminal is coupled to a first signal input; and a third transistor having fifth and sixth current terminals and a third control terminal, wherein the fifth current terminal is coupled to the first current source and the detector input, the sixth current terminal is coupled to the second current source and the current mirror output, and the third control terminal is coupled to a second signal input.

7. An amplifier circuit, comprising:

an amplifier having an amplifier input, a tail current input, and an amplifier output, and capable of generating an output signal at the amplifier output that is representative of a difference of a first input signal and a second input signal;

a resistor coupled to the amplifier output, and capable of lowering an output resistance of the amplifier;

an adaptive bias circuit coupled between the amplifier output and the tail current input, and capable of providing to the tail current input a detection current responsive to the output signal, wherein a gain of the amplifier is increased in response to the output signal; and a diode-connected transistor capable of passing a current to the amplifier output through the resistor.

8. The amplifier circuit of claim 7, wherein the adaptive bias circuit includes a detector circuit capable of generating the detection current based on the output signal.

9. The amplifier circuit of claim 8, wherein the adaptive bias circuit includes a current mirror circuit coupled to the detector circuit and the tail current input, and capable of mirroring the detection current to the tail current input.

10. The amplifier circuit of claim 9, wherein the resistor is a first resistor, the detector circuit includes a first transistor and a second resistor coupled to the first transistor, and the current mirror circuit includes:

a diode-connected transistor including a drain and a gate coupled to the first transistor;

a third resistor coupled to a source of the diode-connected transistor;

a second transistor having a gate coupled to the first transistor, and a drain coupled to the tail current input; and a fourth resistor coupled to the second transistor.

11. The amplifier circuit of claim 10, wherein a gain boost provided to the amplifier by the adaptive bias circuit is a ratio of a resistance of the first resistor to a resistance of the second resistor.

12. The amplifier circuit of claim 7, wherein the adaptive bias circuit is capable of increasing a current flowing through the amplifier in response to an increase in amplitude of a signal at the amplifier output.

13. A voltage regulator circuit, comprising:

an amplifier having an amplifier input, a tail current input, and an amplifier output, and capable of generating an error signal representative of a difference between an output voltage and a reference voltage;

a load resistor coupled to the amplifier output, and capable of lowering an output resistance of the amplifier;

an adaptive bias circuit coupled between the amplifier output and the tail current input, and capable of:

generating a detection current based on the error signal; and providing the detection current to the tail current input to increase a gain of the amplifier in response to the error signal; and a field effect transistor (FET) coupled to the amplifier output, and capable of passing a current in response to the error signal.

14. The voltage regulator circuit of claim 13, wherein the adaptive bias circuit includes a detector circuit capable of generating the detection current based on the error signal.

15. The voltage regulator circuit of claim 14, wherein the adaptive bias circuit includes a current mirror circuit coupled to the detector circuit and the tail current input, and capable of mirroring the detection current to the tail current input.

16. The voltage regulator circuit of claim 15 wherein:

the detector circuit includes a first resistor having a first resistance;

the current mirror circuit includes:

a second resistor having approximately the first resistance; and a third resistor having approximately the first resistance;

the load resistor has a second resistance; and a gain boost provided to the amplifier by the adaptive bias circuit is a ratio of a load resistance to the first resistance.

17. A voltage regulator circuit including:

an amplifier having an amplifier input, a tail current input, and an amplifier output, and capable of generating an output signal at the amplifier output that is representative of a difference of a first input signal and a second input signal;

a resistor coupled to the amplifier output, and capable of lowering an output resistance of the amplifier;

an adaptive bias circuit coupled between the amplifier output and the tail current input, and capable of providing to the tail current input a detection current responsive to the output signal, wherein a gain of the amplifier is increased in response to the output signal; and a diode-connected transistor capable of passing a current to the amplifier output through the resistor; and an output stage coupled to the amplifier output.

* * * * *